(12) United States Patent
Camacho et al.

(10) Patent No.: US 8,344,495 B2
(45) Date of Patent: Jan. 1, 2013

(54) INTEGRATED CIRCUIT PACKAGING SYSTEM WITH INTERCONNECT AND METHOD OF MANUFACTURE THEREOF

(75) Inventors: Zigmund Ramirez Camacho, Singapore (SG); Philip Lyndon Cablao, Singapore (SG); Lionel Chien Hui Tay, Singapore (SG); Frederick Rodriguez Dahilig, Singapore (SG)

(73) Assignee: Stats Chippac Ltd., Singapore (SG)

( * ) Notice: Subject to any disclaimer, the term of this patent is extended or adjusted under 35 U.S.C. 154(b) by 320 days.

(21) Appl. No.: 12/636,696

(22) Filed: Dec. 11, 2009

(65) Prior Publication Data

US 2011/0140261 A1    Jun. 16, 2011

(51) Int. Cl.
*H01L 23/498* (2006.01)
(52) U.S. Cl. ........................... 257/690; 257/700
(58) Field of Classification Search ............. 257/621, 257/774, 690, 700, 778; 438/622, 618, 108
See application file for complete search history.

(56) References Cited

U.S. PATENT DOCUMENTS

| | | | |
|---|---|---|---|
| 5,619,070 A * | 4/1997 | Kozono | 257/692 |
| 5,831,832 A | 11/1998 | Gillette et al. | |
| 5,900,674 A * | 5/1999 | Wojnarowski et al. | 257/774 |
| 6,034,428 A * | 3/2000 | Kawahara et al. | 257/700 |
| 6,573,121 B2 | 6/2003 | Yoneda et al. | |
| 6,781,224 B2 | 8/2004 | Yoneda et al. | |
| 6,864,423 B2 | 3/2005 | Tan et al. | |
| 7,023,077 B2 | 4/2006 | Madrid | |
| 7,202,460 B2 * | 4/2007 | Onodera et al. | 250/208.1 |
| 7,202,556 B2 | 4/2007 | 'Khng et al. | |
| 2006/0131730 A1 | 6/2006 | Nakamura | |

* cited by examiner

*Primary Examiner* — Howard Weiss
*Assistant Examiner* — Sue Tang
(74) *Attorney, Agent, or Firm* — Ishimaru & Associates LLP; Mikio Ishimaru

(57) ABSTRACT

A method of manufacture of an integrated circuit packaging system includes: providing a substrate external layer having an opening; forming a convex interconnect within the opening with the convex interconnect having a protrusion and a horizontal flange substantially horizontally coplanar with the substrate external layer; forming an insulation layer over the substrate external layer and the convex interconnect; forming a horizontal conductive pathway on the insulation layer; forming a single interlayer conductive connector from the horizontal conductive pathway to the convex interconnect; and connecting an integrated circuit and the horizontal conductive pathway.

18 Claims, 7 Drawing Sheets

INTEGRATED CIRCUIT PACKAGING SYSTEM WITH INTERCONNECT AND METHOD OF MANUFACTURE THEREOF

TECHNICAL FIELD

The present invention relates generally to an integrated circuit packaging system, and more particularly to a system for an integrated circuit packaging system with interconnect.

BACKGROUND ART

Modern electronics, such as smart phones, cell phones, digital cameras, personal digital assistants, location based services devices, and enterprise class appliances, are packing more integrated circuits into an ever shrinking physical space with expectations for decreasing cost. As more functions are packed into the integrated circuits and more integrated circuits into the package, integrated circuit packages must continue to provide a mechanism for making electrical interconnection between the integrated circuit die and the leads that are utilized to make electrical interconnections to circuits, power, and ground external to the integrated circuit die. In the early stages of integrated circuit development, there were relatively few connections between the integrated circuit die and the external circuitry.

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance. Different challenges arise from increased functionality integration and miniaturization.

Thus, a need still remains for an integrated circuit packaging system including high input/output density, low cost, and improved reliability. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate external layer having an opening; forming a convex interconnect within the opening with the convex interconnect having a protrusion and a horizontal flange substantially horizontally coplanar with the substrate external layer; forming an insulation layer over the substrate external layer and the convex interconnect; forming a horizontal conductive pathway on the insulation layer; forming a single interlayer conductive connector from the horizontal conductive pathway to the convex interconnect; and connecting an integrated circuit and the horizontal conductive pathway.

The present invention provides an integrated circuit packaging system, including: a module including: a substrate external layer having an opening; a convex interconnect within the opening with the convex interconnect having a protrusion and a horizontal flange substantially horizontally coplanar with the substrate external layer; an insulation layer over the substrate external layer and the convex interconnect; a horizontal conductive pathway on the insulation layer; a single interlayer conductive connector from the horizontal conductive pathway to the convex interconnect; and an integrated circuit connected to the horizontal conductive pathway.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
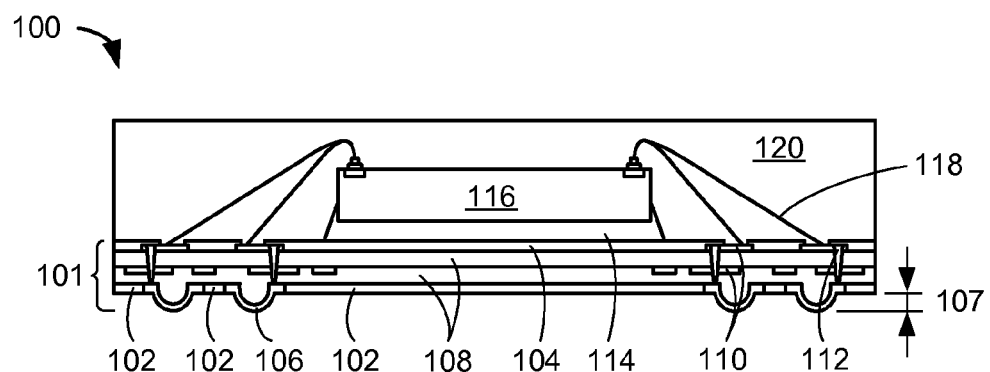
FIG. 1 is a cross-sectional view of an integrated circuit packaging system along a section line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Figure 2:
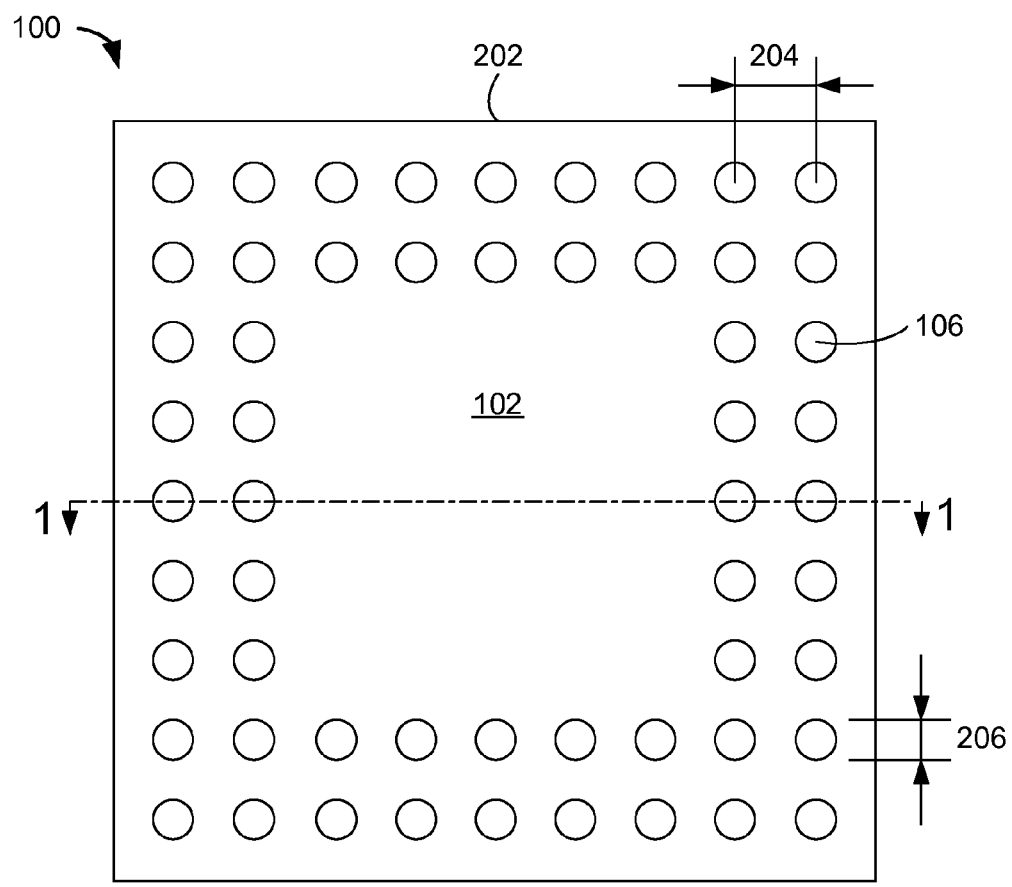
FIG. 2 is a bottom view of the integrated circuit packaging system.

Referring now to FIG. 1, therein is shown a cross-sectional view of an integrated circuit packaging system 100 along a section line 1-1 of FIG. 2 in a first embodiment of the present invention. The integrated circuit packaging system 100 can represent a configuration of a packaging system, which can include a bump chip carrier (BCC), a ball grid array (BGA), a quad flat no-lead (QFN), a land grid array (LGA), a bismaleimide triazine (BT) laminate substrate, a copper-etched multi-row package, a package with a laminate substrate and a built-in bump structure that functions as a stand-off, or a combination thereof.

The integrated circuit packaging system 100 can include a substrate 101, which can represent a laminate structure that provides support and connectivity to external systems (not shown). The substrate 101 can include a first substrate external layer 102 and a second substrate external layer 104, which can represent structures that provide a planar support and an electrical insulation. The first substrate external layer 102 and the second substrate external layer 104 can be formed with a rigid structure to provide a strong support for mounting or attaching thereto.

The first substrate external layer 102 represents the portion of the substrate 101 at the bottom and faces the exterior of the substrate 101. The second substrate external layer 104 represents the portion of the substrate 101 at the top and faces the exterior of the substrate 101. The first substrate external layer 102 and the second substrate external layer 104 are on opposite horizontal sides of the substrate 101.

The first substrate external layer 102 and the second substrate external layer 104 can include a resist, a mask, or a resin. For example, the first substrate external layer 102 and the second substrate external layer 104 include a solder resist, a solder mask, a photo-imageable resist, an epoxy resin, a polyimide, a plastic mask, or an insulating material.

The substrate 101 can include a convex interconnect 106, such as a bump, a stand-off, a terminal, a pad, a lead, or a contact. The convex interconnect 106 can provide connectivity to external systems (not shown).

The convex interconnect 106 can be formed within the first substrate external layer 102. The first substrate external layer 102 can function as an insulator between the convex interconnect 106 and another of the convex interconnect 106.

The convex interconnect 106 can include a predetermined height 107, which can include a vertical dimension from a tip or a bottom surface of the convex interconnect 106 to a bottom of the integrated circuit packaging system 100. The convex interconnect 106 with the predetermined height 107 can serve as a stand-off that can be bigger than that of conventional packages, which can include ball grid array (BGA) or land grid array (LGA).

The substrate 101 can include a structure that can be formed by any number of insulation layers 108, which can include a pre-preg, a dielectric, an organic or inorganic material, an epoxy, a glass, a resin, an organic epoxy-glass resin, a bismaleimide triazine (BT), a plastic or ceramic material, a thermoplastic material, or a combination thereof. The insulation layers 108 can be formed over or on the first substrate external layer 102 and the convex interconnect 106.

The substrate 101 can include one of the insulation layers 108 formed or stacked over or on another of the insulation layers 108. For illustrative purposes, the cross-sectional view depicts two of the insulation layers 108, although it is understood that the integrated circuit packaging system 100 can include any number of the insulation layers 108.

The substrate 101 can include horizontal conductive pathways 110, which can include a trace, a line, a wire, or a routing line. The horizontal conductive pathways 110 allow for electricity to pass from an element to another element. The horizontal conductive pathways 110 can be formed over or on the insulation layers 108.

The substrate 101 can include a single interlayer conductive connector 112, which can include a single integral structure or a solid structure. The single interlayer conductive connector 112 can be formed with a via, a post, or a pillar and filled with a conductive material. The single interlayer conductive connector 112 can be formed to provide an electrical connection between the horizontal conductive pathways 110 and the convex interconnect 106.

The second substrate external layer 104 can be formed over or on the insulation layers 108, the horizontal conductive pathways 110, or the single interlayer conductive connector 112. The second substrate external layer 104 can expose portions of the horizontal conductive pathways 110.

The integrated circuit packaging system 100 can include an integrated circuit attach layer 114, such as a die attach, an adhesive, a film, or an epoxy, attached over or on the second substrate external layer 104. The integrated circuit attach layer 114 can be provided with thermally conductive capabilities.

The integrated circuit packaging system 100 can include an integrated circuit 116, such as an integrated circuit die, a wirebond integrated circuit, or a chip, attached to or mounted over the second substrate external layer 104 with the integrated circuit attach layer 114. The integrated circuit packaging system 100 can include an internal interconnect 118, such as a bond wire, a ribbon bond wire, or a conductive wire, attached or connected to the integrated circuit 116 and the horizontal conductive pathways 110. The integrated circuit 116 can be attached to the portions of the horizontal conductive pathways 110 that are exposed from the second substrate external layer 104.

The integrated circuit packaging system 100 can include an encapsulation 120, such as a cover including an epoxy molding compound, an encapsulation material, or a molding material. The encapsulation 120 can be formed over the horizontal conductive pathways 110, the second substrate external layer 104, the integrated circuit 116, and the internal interconnect 118. The first substrate external layer 102 or the convex interconnect 106 can be exposed at the bottom of the integrated circuit packaging system 100.

It has been discovered that the present invention provides the integrated circuit packaging system 100 with improved yield. Conventional or ordinary packages (e.g. BGA) have attached tin (Sn) or lead (Pb) reflowed solder balls to connect with external systems. There can be solder ball bridging problems during solder ball attach reflow processes that contribute to yield loss. Manufacture of such conventional packages also requires a solder ball attach process that needs additional material and reflow heating to create stand-offs. The attach process is an energy and resource consuming process. The present invention integrates the first substrate external layer 102, the insulation layers 108, the horizontal conductive pathways 110, and the single interlayer conductive connector 112 together with the convex interconnect 106. Such integration includes the convex interconnect 106 as a built-in bump structure for interconnectivity with external systems without the solder balls used in the conventional packages, thereby providing improved yield and process simplicity.

It has also been discovered that the present invention provides the integrated circuit packaging system 100 that is eco-friendly. The manufacturing process of forming the convex interconnect 106 provides an extreme energy and cost savings measure and is better for the environment because the manufacturing process avoids usage of solderball, flux, and waste water processing that is involved in the conventional solderball attach processes.

It has further been discovered that the present invention provides the integrated circuit packaging system 100 with increased reliability. In order to achieve acceptable reliability, conventional packages (e.g. BGA with solder balls or LGA) must have a required stand-off height. However, as package density and the number of inputs/outputs (I/Os) increase, the size of the solder balls (e.g. with BGA packages) is constrained to achieve a specified ball pitch. For example, increasing ball sizes can cause solder ball bridging problems during solder ball attach reflow processes. The present invention provides the convex interconnect 106 that can serve as plated bumps with the predetermined height 107 in order to achieve a good board level reliability (BLR) test performance thereby improving the overall reliability.

Referring now to FIG. 2, therein is shown a bottom view of the integrated circuit packaging system 100. The bottom view depicts the first substrate external layer 102 and the convex interconnect 106.

The convex interconnect 106 can include a pitch 204, which can include a distance from a center of the convex interconnect 106 to that of another of the convex interconnect 106 that is adjacent to the convex interconnect 106. As an example, the convex interconnect 106 can include the pitch 204 formed greater than 0.3 millimeters (mm) from the another of the convex interconnect 106.

The convex interconnect 106 can include a size 206, which can include a distance from a point to another point on a surface of the convex interconnect 106. The size 206 can be lesser than 12 milli-inches (mils).

The convex interconnect 106 can be formed in multiple rows along a periphery 202 of the integrated circuit packaging system 100. For illustrative purposes, the bottom view depicts the convex interconnect 106 formed in two rows, although the convex interconnect 106 can be formed in any number of rows.

It has been discovered that the present invention provides the integrated circuit packaging system 100 with higher input/output (I/O) density. The integrated circuit packaging system 100 is configured for smaller, finer I/O size and I/O pitch. As an example, the convex interconnect 106 includes the pitch 204 greater than 0.3 mm and the size 206 lesser than 12 mils, providing a high I/O count without having limitations of using the solder ball attach process in conventional packages (e.g. BGA) that are becoming more tedious as the I/O pitch gets finer than 0.5 mm and ball sizes less than 12 mils.

Figure 3:
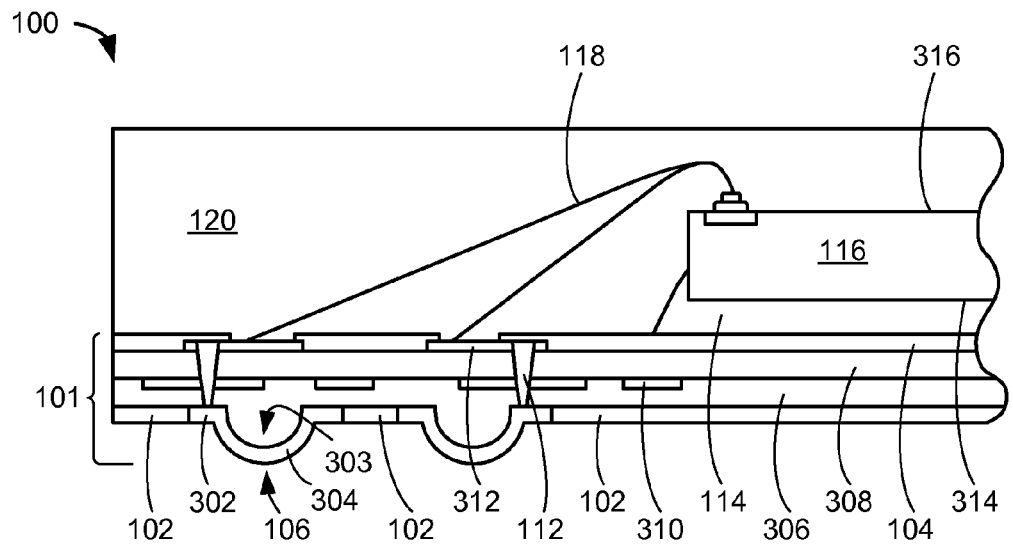
FIG. 3 is a more detailed cross-sectional view of a portion of the integrated circuit packaging system along the section line 1-1 of FIG. 2.

Referring now to FIG. 3, therein is shown a more detailed cross-sectional view of a portion of the integrated circuit packaging system 100 along the section line 1-1 of FIG. 2. The more detailed cross-sectional view depicts the substrate 101 having the first substrate external layer 102 and the second substrate external layer 104.

The first substrate external layer 102 can function to ensure that an attach material (not shown) remains within the desired area when the integrated circuit packaging system 100 is mounted over an external support structure (not shown), which can include a substrate, a carrier, or a printed circuit board (PCB). For example, the first substrate external layer 102 keeps solder where the integrated circuit packaging system 100 is to be soldered, preventing short circuits caused by solder bridges.

Besides preventing potential short circuits, the first substrate external layer 102 can also function to protect the integrated circuit packaging system 100. For example, the first substrate external layer 102 provides electrical insulation or protection against oxidation and corrosion, thereby improving an overall reliability of the integrated circuit packaging system 100.

The convex interconnect 106 can include a horizontal flange 302, and a protrusion 304 having a cavity 303. The horizontal flange 302 can function as an attachment site for the single interlayer conductive connector 112 to be connected thereto.

The horizontal flange 302 horizontally extends to a side of the convex interconnect 106. The horizontal flange 302 can be substantially horizontally coplanar with a bottom surface and a top surface of the first substrate external layer 102.

The cavity 303 of the protrusion 304 outwardly extends from the horizontal flange 302 or a bottom surface of the first substrate external layer 102. For illustrative purposes, the protrusion 304 is shown as a dome, although the protrusion 304 can be formed in a different shape. For example, the protrusion 304 can be formed having a structure of a cylinder, a pyramid, or a prism.

The insulation layers 108 of FIG. 1 can include a first insulation layer 306 and a second insulation layer 308. The first insulation layer 306 can be formed over the first substrate external layer 102 and the convex interconnect 106.

The horizontal conductive pathways 110 of FIG. 1 can include a first horizontal conductive pathway 310 and a second horizontal conductive pathway 312. The first horizontal conductive pathway 310 can be formed over the first insulation layer 306, which can function as an insulation layer that physically isolates or electrically insulates the first horizontal conductive pathway 310 from the convex interconnect 106.

The second insulation layer 308 can be formed over the first insulation layer 306 and the first horizontal conductive pathway 310. The second horizontal conductive pathway 312 can be formed over the second insulation layer 308, which can function as an insulation layer that physically isolates or electrically insulates the second horizontal conductive pathway 312 from the first horizontal conductive pathway 310. The second horizontal conductive pathway 312 can provide an attachment or connection site for the internal interconnect 118 to be attached thereto.

The single interlayer conductive connector 112 can be formed in a single integral structure or a solid structure, electrically connecting the horizontal flange 302 of the convex interconnect 106, the first horizontal conductive pathway 310, and the second horizontal conductive pathway 312. The single interlayer conductive connector 112 can extend from a top surface of the second horizontal conductive pathway 312 to a top surface of the horizontal flange 302. A top portion of the single interlayer conductive connector 112 can be substantially coplanar with the top surface of the second horizontal conductive pathway 312.

The second substrate external layer 104 can be formed over the single interlayer conductive connector 112, the second insulation layer 308, and the second horizontal conductive pathway 312. The second substrate external layer 104 can partially expose the second horizontal conductive pathway 312. A portion of the second horizontal conductive pathway 312 that is exposed from the second substrate external layer 104 can provide an attachment site for the internal interconnect 118 to be attached thereto.

The integrated circuit 116 can include an integrated circuit inactive side 314, such as a backside, and an integrated circuit active side 316 having active circuitry thereon at an opposing side to the integrated circuit inactive side 314. The integrated circuit inactive side 314 can be attached to the second substrate external layer 104 with the integrated circuit attach layer 114.

The internal interconnect 118 can be attached to the integrated circuit active side 316 of the integrated circuit 116 and the portion of the second horizontal conductive pathway 312 that is exposed from the second substrate external layer 104. The second horizontal conductive pathway 312 that is attached to the internal interconnect 118 can be electrically connected to the convex interconnect 106 with the single interlayer conductive connector 112. The integrated circuit 116 can be electrically connected to the convex interconnect 106, the first horizontal conductive pathway 310, and the second horizontal conductive pathway 312 with the single interlayer conductive connector 112 and the internal interconnect 118.

The encapsulation 120 can be formed over the first substrate external layer 102, the convex interconnect 106, the first insulation layer 306, the first horizontal conductive pathway 310, the second insulation layer 308, the second horizontal conductive pathway 312, the single interlayer conductive connector 112, and the second substrate external layer 104. The encapsulation 120 can cover the integrated circuit attach layer 114, the integrated circuit 116, and the internal interconnect 118. The first substrate external layer 102 or the convex interconnect 106 can be exposed from the bottom of the integrated circuit packaging system 100.

Figure 4:
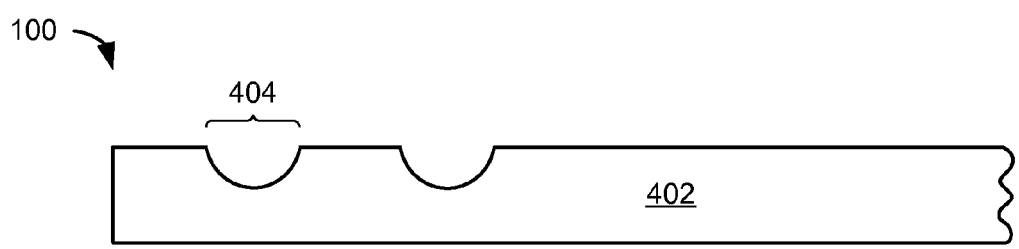
FIG. 4 is a cross-sectional view of a portion of the integrated circuit packaging system along the section line 1-1 of FIG. 2 in an assembly process of a forming phase of a sacrificial layer.

Referring now to FIG. 4, therein is shown a cross-sectional view of a portion of the integrated circuit packaging system 100 along the section line 1-1 of FIG. 2 in an assembly process of a forming phase of a sacrificial layer 402. The sacrificial layer 402 can include a bare strip, a solid sheet, a panel, or a lead frame that is etched, stamped, cut, or a combination thereof. The sacrificial layer 402 can preferably include copper (Cu), any other metallic element, or an alloy.

The sacrificial layer 402 can be half-etched, partially etched, or partially removed to form a recess 404. The sacrificial layer 402 can be etched with any etching techniques. For example, the etching techniques include wet etching, dry etching, or chemical vapor etching. Alternatively, the sacrificial layer 402 can be partially removed with other techniques which include coining, grinding, polishing, or scouring, as examples.

Figure 5:
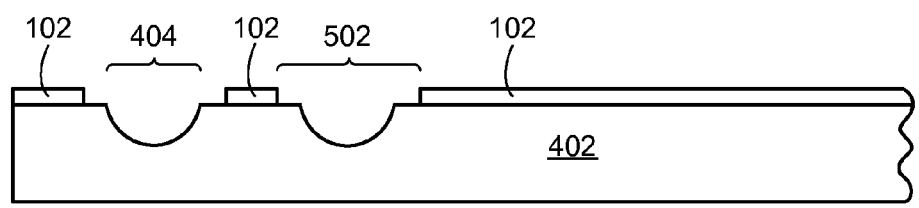
FIG. 5 is a cross-sectional view of the structure of FIG. 4 in a forming phase of the first substrate external layer.

Referring now to FIG. 5, therein is shown a cross-sectional view of the structure of FIG. 4 in a forming phase of the first substrate external layer 102. The first substrate external layer 102 can be formed on the sacrificial layer 402.

The first substrate external layer 102 can include an opening 502 exposing a portion of a top surface and the recess 404 of the sacrificial layer 402. The portion of the top surface of the sacrificial layer 402 that is exposed can surround or is adjacent the recess 404.

The opening 502 can differ in shapes and sizes. For example, the opening 502 includes a shape of a circle, a square, a rectangle, a triangle, a polygon, a parallelogram, or a rhombus. Also for example, the opening 502 includes a horizontal dimension that is larger than that of the recess 404.

The first substrate external layer 102 can be formed by a number of processes. For example, the first substrate external layer 102 can be formed with a selective solder resist application through masking. Also for example, the first substrate external layer 102 can be formed with a photoresist process or a patterning process to form the opening 502 in the first substrate external layer 102.

Figure 6:
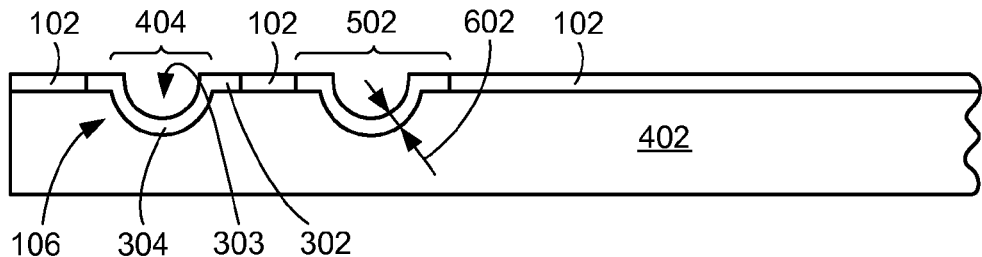
FIG. 6 is a cross-sectional view of the structure of FIG. 5 in a forming phase of the convex interconnect.

Referring now to FIG. 6, therein is shown a cross-sectional view of the structure of FIG. 5 in a forming phase of the convex interconnect 106. The portion of the top surface of the sacrificial layer 402 that is exposed within the opening 502 and an inner surface of the recess 404 can be plated with a conductive material to form the horizontal flange 302 and the protrusion 304 of the convex interconnect 106, respectively. The horizontal flange 302 can be formed within the first substrate external layer 102.

The convex interconnect 106 can preferably be formed of a common material having characteristics being formed from a single integral structure with a thickness 602. The thickness 602 can be optionally substantially uniform. In other words, the horizontal flange 302 and the protrusion 304 can have substantially the same thickness.

The convex interconnect 106 can be formed within the opening 502 and on the sacrificial layer 402. The first substrate external layer 102 can provide electrical insulation between the convex interconnect 106 and another of the convex interconnect 106.

The convex interconnect 106 can include the protrusion 304 having the cavity 303. The cavity 303 can be formed as a result of an etching process in forming the recess 404 of the sacrificial layer 402.

The conductive material used in the plating processes can preferably include nickel (Ni), palladium (Pd), gold (Au), copper (Cu), any other conductive element, or a combination thereof. The conductive material can include a non-oxidizing metal that can be attached or connected to external contacts or electrodes.

The convex interconnect 106 can be formed by plating processes. For example, the plating processes include a thin-film forming process, an evaporating process, a sputtering process, an electro-plating process, or a metal paste filling process.

Figure 7:
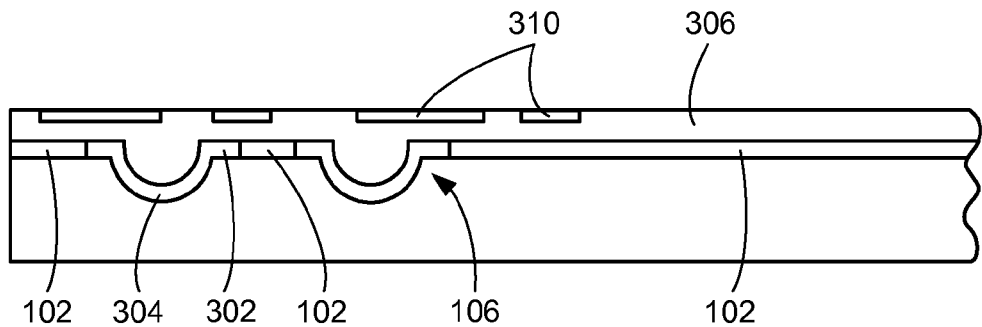
FIG. 7 is a cross-sectional view of the structure of FIG. 6 in a forming phase of the first horizontal conductive pathway.

Referring now to FIG. 7, therein is shown a cross-sectional view of the structure of FIG. 6 in a forming phase of the first horizontal conductive pathway 310. The first insulation layer 306 can be formed on the first substrate external layer 102, the horizontal flange 302, and the protrusion 304.

The first horizontal conductive pathway 310 can be formed on the first insulation layer 306. The first horizontal conductive pathway 310 can be formed by any formation technique, which can include lamination, pattering, sputtering, cladding, mask attaching, etching, mask removing or stripping, or a combination thereof.

The first horizontal conductive pathway 310 can be pressed onto the first insulation layer 306, resulting in the first horizontal conductive pathway 310 substantially horizontally coplanar with the first insulation layer 306. The first horizontal conductive pathway 310 can be pressed using any pressing process, which can include temperature (e.g. heat or cold), pressure, or a combination thereof. The first insulation layer 306 can electrically insulate the first horizontal conductive pathway 310 and the convex interconnect 106.

Figure 8:
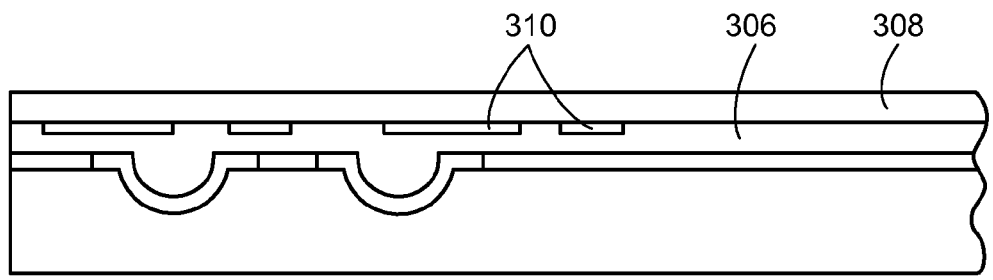
FIG. 8 is a cross-sectional view of the structure of FIG. 7 in a forming phase of the second insulation layer.

Referring now to FIG. 8, therein is shown a cross-sectional view of the structure of FIG. 7 in a forming phase of the second insulation layer 308. The second insulation layer 308 can be formed on the first insulation layer 306 and the first horizontal conductive pathway 310. The process and procedures used to form the first horizontal conductive pathway 310 can be used to form the second insulation layer 308.

Figure 9:
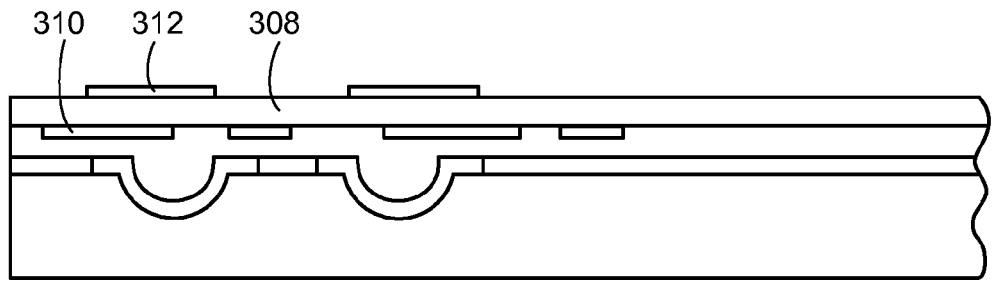
FIG. 9 is a cross-sectional view of the structure of FIG. 8 in a forming phase of the second horizontal conductive pathway.

Referring now to FIG. 9, therein is shown a cross-sectional view of the structure of FIG. 8 in a forming phase of the second horizontal conductive pathway 312. The second horizontal conductive pathway 312 can be formed on the second insulation layer 308. The second horizontal conductive pathway 312 can be formed in a manner similar to the first horizontal conductive pathway 310.

The second horizontal conductive pathway 312 can be plated with a conductive material such that an upper surface of the second horizontal conductive pathway 312 can provide a reliable connection with the internal interconnect 118 of FIG. 1. For example, the conductive material includes nickel (Ni), palladium (Pd), gold (Au), any other conductive material, or a combination thereof Referring now to FIG. 10, therein is shown a cross-sectional view of the structure of FIG. 9 in a forming phase of the single interlayer conductive connector 112. The single interlayer conductive connector 112 can be formed to connect the convex interconnect 106, the first horizontal conductive pathway 310, and the second horizontal conductive pathway 312, as an example. The single interlayer conductive connector 112 can be formed to be connected to the horizontal flange 302.

The single interlayer conductive connector 112 can be formed by chemical, physical, or laser means. For example, the single interlayer conductive connector 112 can be formed using an etching process or a drilling process.

The single interlayer conductive connector 112 can be formed through the first insulation layer 306, the second insulation layer 308, the first horizontal conductive pathway 310, and the second horizontal conductive pathway 312. The single interlayer conductive connector 112 can be filled with a conductive material, which can include copper (Cu), aluminum (Al), Magnesium (Mg), tungsten (W), a conductive paste, a conductive metal powder, or any metallic or non-metallic material.

For illustrative purposes, the single interlayer conductive connector 112 is shown with a shape of a cone, although the single interlayer conductive connector 112 can be formed with different shapes. For example, the single interlayer conductive connector 112 includes a shape of a cube, a pyramid, or a sphere.

Figure 10:
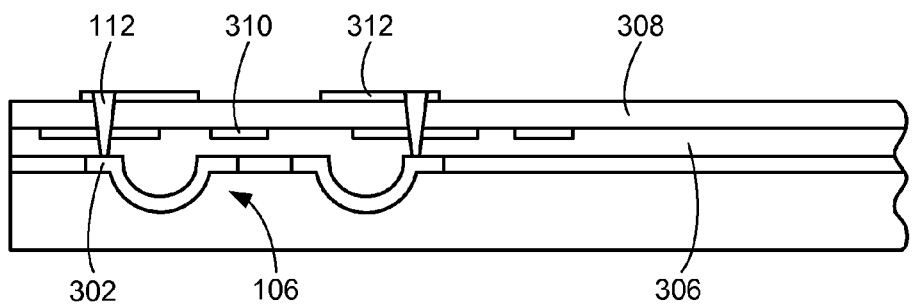
FIG. 10 is a cross-sectional view of the structure of FIG. 9 in a forming phase of the single interlayer conductive connector.
Figure 11:
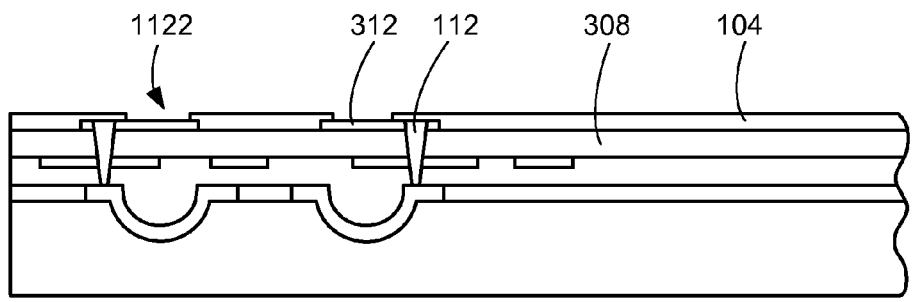
FIG. 11 is a cross-sectional view of the structure of FIG. 10 in a forming phase of the second substrate external layer.

Referring now to FIG. 11, therein is shown a cross-sectional view of the structure of FIG. 10 in a forming phase of the second substrate external layer 104. The second substrate external layer 104 can be formed over or on the single interlayer conductive connector 112, the second insulation layer 308, and the second horizontal conductive pathway 312.

The second substrate external layer 104 can include a hole 1102 exposing a portion of a top surface of the second horizontal conductive pathway 312. The second substrate external layer 104 can be formed by a number of processes. For example, the second substrate external layer 104 can be formed with a selective solder resist application through masking. Also for example, the second substrate external layer 104 can be formed with a photoresist process or a patterning process to form the hole 1102 in the second substrate external layer 104.

Figure 12:
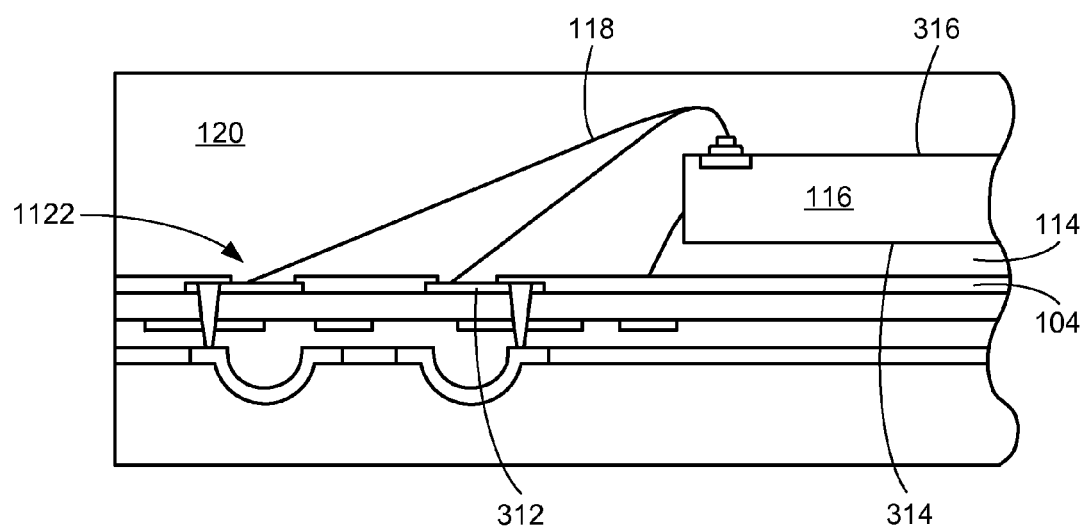
FIG. 12 is a cross-sectional view of the structure of FIG. 11 in a forming phase of the encapsulation.

Referring now to FIG. 12, therein is shown a cross-sectional view of the structure of FIG. 11 in a forming phase of the encapsulation 120. The integrated circuit inactive side 314 of the integrated circuit 116 can be attached to the second substrate external layer 104 with the integrated circuit attach layer 114. The internal interconnect 118 can be attached to the integrated circuit active side 316 of the integrated circuit 116 and the portion of the second horizontal conductive pathway 312 that is exposed from the second substrate external layer 104 in the hole 1102.

The encapsulation 120 can be formed over the second horizontal conductive pathway 312 and the second substrate external layer 104. The encapsulation 120 can be formed to cover the integrated circuit attach layer 114, the integrated circuit 116, and the internal interconnect 118.

Figure 13:
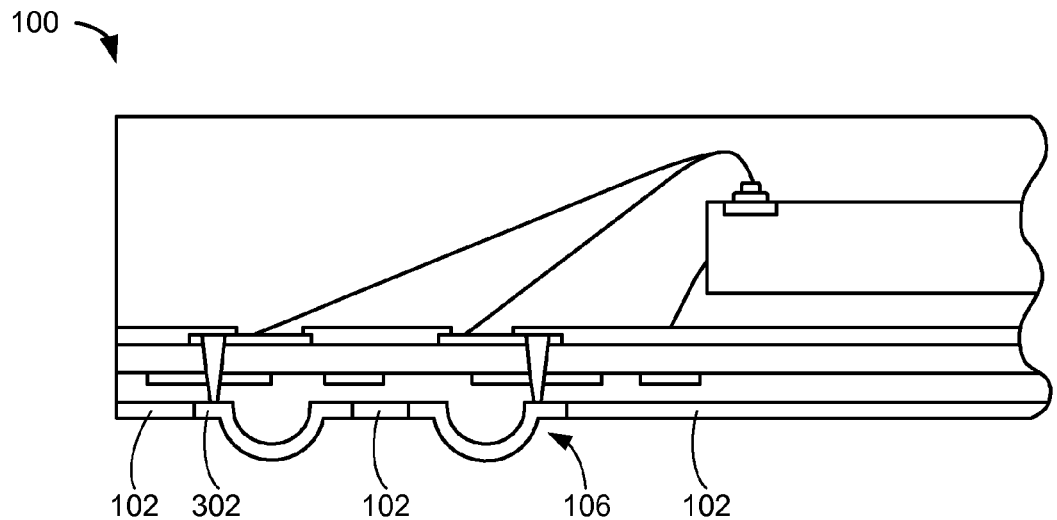
FIG. 13 is a cross-sectional view of the structure of FIG. 12 in a removing phase of the sacrificial layer of FIG. 4.

Referring now to FIG. 13, therein is shown a cross-sectional view of the structure of FIG. 12 in a removing phase of the sacrificial layer 402 of FIG. 4. The sacrificial layer 402 can be removed from the bottom surface of the integrated circuit packaging system 100. The sacrificial layer 402 can be removed by etching or peeling.

Besides etching and peeling, the sacrificial layer 402 can be removed by other types of processes including mechanical or laser processes. For example, grinding, sanding, or any other mechanical means can remove the sacrificial layer 402.

With the sacrificial layer 402 removed, the first substrate external layer 102 and the convex interconnect 106 can be exposed at the bottom of the integrated circuit packaging system 100. The first substrate external layer 102 can be substantially coplanar with the horizontal flange 302 of the convex interconnect 106. After the removal process, singulation can be performed by mechanical or optical means, such as cutting, sawing, or laser scribing, to produce individual package units of the integrated circuit packaging system 100.

The first substrate external layer 102 and the convex interconnect 106 can include characteristics of the sacrificial layer 402 removed. The characteristics of the sacrificial layer 402 removed can include physical features, such as an etched surface, grinding marks, sanding marks, polishing marks, other removal tool marks, chemical residue, or a chemically processed surface.

Figure 14:
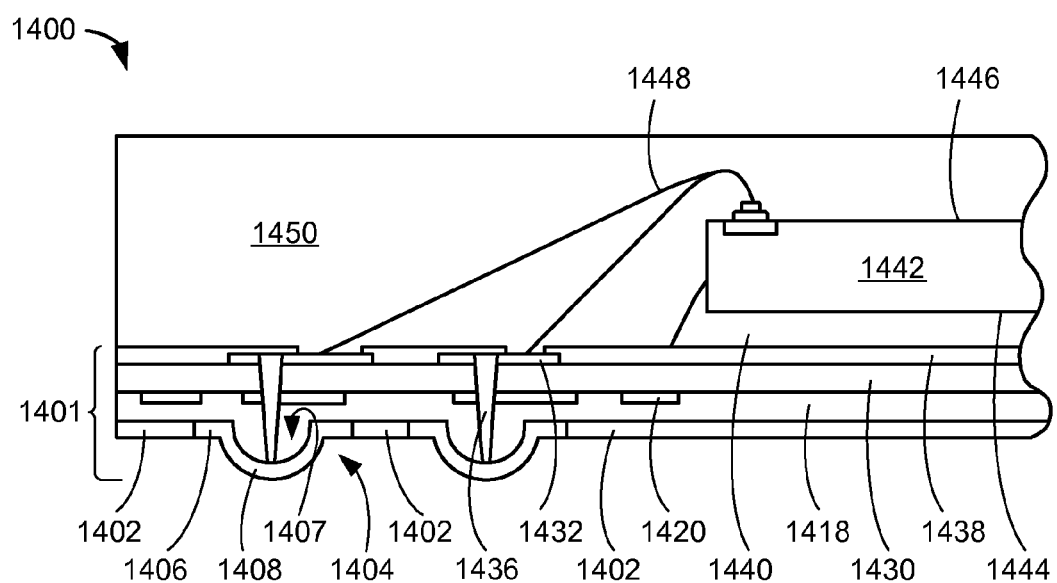
FIG. 14 is a cross-sectional view similar to FIG. 3 of an integrated circuit packaging system in a second embodiment of the present invention.

Referring now to FIG. 14, therein is shown a cross-sectional view similar to FIG. 3 of an integrated circuit packaging system 1400 in a second embodiment of the present invention. The integrated circuit packaging system 1400 can be similar to the integrated circuit packaging system 100 of FIG. 3, except for the formation of the single interlayer conductive connector 112 of FIG. 3.

The cross-sectional view depicts a substrate 1401 having a first substrate external layer 1402 and a convex interconnect 1404, having a horizontal flange 1406, a cavity 1407, and a protrusion 1408, adjacent the first substrate external layer 1402. The first substrate external layer 1402 and the convex interconnect 1404 can be formed in a manner similar to the first substrate external layer 102 of FIG. 3, and the convex interconnect 106 of FIG. 3, respectively.

The first substrate external layer 1402 can provide electrical insulation between the convex interconnect 1404 and another of the convex interconnect 1404. The horizontal flange 1406 can laterally extend to a side of the convex interconnect 1404. The horizontal flange 1406 can be substantially coplanar with the first substrate external layer 1402. The protrusion 1408 can outwardly extend from the horizontal flange 1406 or a bottom surface of the integrated circuit packaging system 1400.

The cross-sectional view depicts a first insulation layer 1418 over the first substrate external layer 1402 and the convex interconnect 1404. A first horizontal conductive pathway 1420 can be formed over the first insulation layer 1418. The first insulation layer 1418 and the first horizontal conductive pathway 1420 can be formed in a manner similar to the first insulation layer 306 of FIG. 3 and the first horizontal conductive pathway 310 of FIG. 3, respectively.

A second insulation layer 1430 can be formed over the first insulation layer 1418 and the first horizontal conductive pathway 1420. A second horizontal conductive pathway 1432 can be formed over the second insulation layer 1430. The second insulation layer 1430 and the second horizontal conductive pathway 1432 can be formed in a manner similar to the second insulation layer 308 of FIG. 3 and the second horizontal conductive pathway 312 of FIG. 3, respectively.

The integrated circuit packaging system 1400 can include a single interlayer conductive connector 1436, which can include a via, a post, or a pillar and filled with a conductive material. The protrusion 1408 can function as an attachment site for the single interlayer conductive connector 1436 to be connected thereto. The single interlayer conductive connector 1436 can be formed in a single integral structure or a solid structure, electrically connecting the protrusion 1408, the first horizontal conductive pathway 1420, and the second horizontal conductive pathway 1432.

The single interlayer conductive connector 1436 can be formed in a manner similar to the single interlayer conductive connector 112, except that the single interlayer conductive connector 1436 can extend from a top surface of the second horizontal conductive pathway 1432 to a top surface of the protrusion 1408. The single interlayer conductive connector 1436 can be substantially coplanar with the top surface of the second horizontal conductive pathway 1432.

The single interlayer conductive connector 1436 can be formed to be connected to the protrusion 1408. The protrusion 1408 can include a greater surface area than the horizontal flange 1406 to provide more area to connect to the single interlayer conductive connector 1436, thereby resulting in increased reliability.

The cross-sectional view depicts a second substrate external layer 1438 over the second insulation layer 1430, the second horizontal conductive pathway 1432, and the single interlayer conductive connector 1436. The cross-sectional view also depicts an integrated circuit attach layer 1440, an integrated circuit 1442 having an integrated circuit inactive side 1444 and an integrated circuit active side 1446, an internal interconnect 1448, and an encapsulation 1450. The second substrate external layer 1438, the integrated circuit attach layer 1440, the integrated circuit 1442, the internal interconnect 1448, and the encapsulation 1450 can be formed in a manner similar to the second substrate external layer 104 of FIG. 3, the integrated circuit attach layer 114 of FIG. 3, the integrated circuit 116 of FIG. 3, the internal interconnect 118 of FIG. 3, and the encapsulation 120 of FIG. 3, respectively.

It has been discovered that the present invention provides the integrated circuit packaging system 1400 with further increased reliability. The protrusion 1408 can include a greater surface area than the horizontal flange 1406 to provide more area to connect to the single interlayer conductive connector 1436, thereby resulting in increased reliability, increased yield, use of lower precision equipment, and lower cost.

Figure 15:
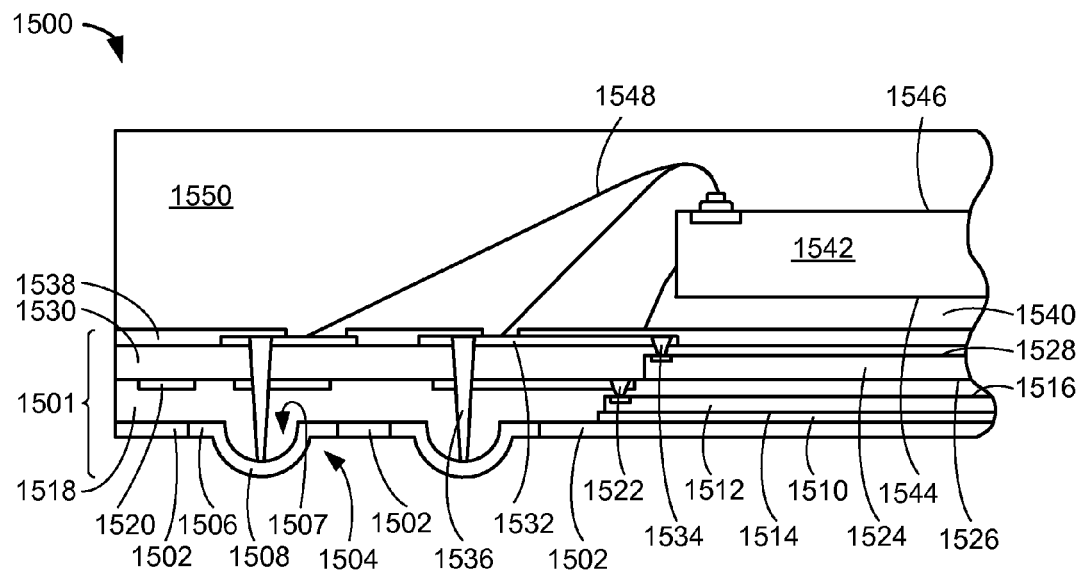
FIG. 15 is a cross-sectional view similar to FIG. 3 of an integrated circuit packaging system in a third embodiment of the present invention.

Referring now to FIG. 15, therein is shown a cross-sectional view similar to FIG. 3 of an integrated circuit packaging system 1500 in a third embodiment of the present invention. The integrated circuit packaging system 1500 can be similar to the integrated circuit packaging system 100 of FIG. 3, except for additional devices and the formation of the single interlayer conductive connector 112 of FIG. 3.

The cross-sectional view depicts a substrate 1501 having a first substrate external layer 1502 and a convex interconnect 1504, having a horizontal flange 1506, a cavity 1507, and a protrusion 1508, adjacent the first substrate external layer 1502. The first substrate external layer 1502 and the convex interconnect 1504 can be formed in a manner similar to the first substrate external layer 102 of FIG. 3 and the convex interconnect 106 of FIG. 3, respectively.

The first substrate external layer 1502 can provide electrical insulation between the convex interconnect 1504 and another of the convex interconnect 1504. The horizontal flange 1506 can laterally extend to a side of the convex interconnect 1504. The horizontal flange 1506 can be substantially coplanar with the first substrate external layer 1502. The protrusion 1508 can outwardly extend from the horizontal flange 1506 or a bottom surface of the integrated circuit packaging system 1500.

The integrated circuit packaging system 1500 can include a device attach layer 1510, such as an adhesive, a die attach, a film, or an epoxy. A device 1512, such as an integrated circuit die, an embedded chip, a wirebond integrated circuit, or a chip, can be attached to or mounted over the first substrate external layer 1502 and adjacent the convex interconnect 1504 with the device attach layer 1510.

For illustrative purposes, the cross-sectional view depicts the device attach layer 1510, although it is understood that the device attach layer 1510 can be optionally formed. For example, when the first substrate external layer 1502 is still soft, the device 1512 can be attached to or mounted on the first substrate external layer 1502 without the device attach layer 1510.

The device 1512 can include a device inactive side 1514, such as a backside, and a device active side 1516 having active circuitry thereon at an opposing side to the device inactive side 1514. The device inactive side 1514 can be attached to the first substrate external layer 1502 with the device attach layer 1510.

A first insulation layer 1518 can be formed over the first substrate external layer 1502, the convex interconnect 1504, the device attach layer 1510, and the device 1512. A first horizontal conductive pathway 1520 can be formed over the first insulation layer 1518. The first horizontal conductive pathway 1520 can be formed in a manner similar to the first horizontal conductive pathway 310 of FIG. 3. The first insulation layer 1518 can electrically insulate the device 1512 and the first horizontal conductive pathway 1520.

The integrated circuit packaging system 1500 can include a device conductive connector 1522, which can include a via, a post, or a pillar and filled with a conductive material. The device conductive connector 1522 can function as an electrical connection between the device 1512 and the first horizontal conductive pathway 1520. The device conductive connector 1522 can be formed by chemical, physical, or laser process. For example, the device conductive connector 1522 can be formed using an etching process or a drilling process.

The device conductive connector 1522 can be formed through the first insulation layer 1518 and the first horizontal conductive pathway 1520. The device conductive connector 1522 can be filled with a conductive material, which can include copper (Cu), aluminum (Al), Magnesium (Mg), tungsten (W), a conductive paste, a conductive metal powder, or any metallic or non-metallic material.

For illustrative purposes, the device conductive connector 1522 is shown with a shape of a cone, although the device conductive connector 1522 can be formed with different shapes. For example, the device conductive connector 1522 includes a shape of a cube, a pyramid, or a sphere.

The device conductive connector 1522 can extend or connect from a top surface of the first horizontal conductive pathway 1520 to the device active side 1516. The device conductive connector 1522 can be substantially coplanar with the top surface of the first horizontal conductive pathway 1520.

The integrated circuit packaging system 1500 can include a component 1524, such as an integrated circuit die, an embedded chip, a wirebond integrated circuit, or a chip, mounted over or on the first insulation layer 1518.

The component 1524 can include a component inactive side 1526, such as a backside, and a component active side 1528 having active circuitry thereon at an opposing side to the component inactive side 1526. The component inactive side 1526 can be mounted over or on the first insulation layer 1518.

A second insulation layer 1530 can be formed over the first insulation layer 1518, the first horizontal conductive pathway 1520, and the component 1524. A second horizontal conductive pathway 1532 can be formed over the second insulation layer 1530. The second horizontal conductive pathway 1532 can be formed in a manner similar to the second horizontal conductive pathway 312 of FIG. 3.

The integrated circuit packaging system 1500 can include a component conductive connector 1534, which can include a via, a post, or a pillar and filled with a conductive material. The component conductive connector 1534 can function as an electrical connection between the component 1524 and the second horizontal conductive pathway 1532. The component conductive connector 1534 can be formed by chemical, physical, or laser means. For example, the component conductive connector 1534 can be formed using an etching process or a drilling process.

The component conductive connector 1534 can be formed through the second insulation layer 1530 and the second horizontal conductive pathway 1532. The component conductive connector 1534 can be filled with a conductive material, which can include copper (Cu), aluminum (Al), Magnesium (Mg), tungsten (W), a conductive paste, a conductive metal powder, or any metallic or non-metallic material.

The component conductive connector 1534 can extend or connect from a top surface of the second horizontal conductive pathway 1532 to the component active side 1528. The component conductive connector 1534 can be substantially coplanar with the top surface of the second horizontal conductive pathway 1532.

For illustrative purposes, the component conductive connector 1534 is shown with a shape of a cone, although the component conductive connector 1534 can be formed with different shapes. For example, the component conductive connector 1534 includes a shape of a cube, a pyramid, or a sphere.

Also for illustrative purposes, the cross-sectional view is shown with the component 1524 and the component conductive connector 1534, although it is understood that the component 1524 and the component conductive connector 1534 can be optionally formed. For example, the integrated circuit packaging system 1500 can include just the component 1524 and the device conductive connector 1522.

The integrated circuit packaging system 1500 can include a single interlayer conductive connector 1536, which can include a via, a post, or a pillar and filled with a conductive material. The protrusion 1508 can function as an attachment site for the single interlayer conductive connector 1536 to be connected thereto. The single interlayer conductive connector 1536 can be formed in a single integral structure or a solid structure, electrically connecting the protrusion 1508, the first horizontal conductive pathway 1520, and the second horizontal conductive pathway 1532.

The single interlayer conductive connector 1536 can be formed in a manner similar to the single interlayer conductive connector 112, except that the single interlayer conductive connector 1536 can extend from a top surface of the second horizontal conductive pathway 1532 to a top surface of the protrusion 1508. The single interlayer conductive connector 1536 can be substantially coplanar with the top surface of the second horizontal conductive pathway 1532.

The single interlayer conductive connector 1536 can be formed to be connected to the protrusion 1508. The protrusion 1508 can include a greater surface area than the horizontal flange 1506 to provide more area to attach the single interlayer conductive connector 1536, thereby resulting in increased reliability. The integrated circuit packaging system 1500 can include another of the single interlayer conductive connector 1536 adjacent the single interlayer conductive connector 1536 and connected to the convex interconnect 1504, the first horizontal conductive pathway 1520, and the second horizontal conductive pathway 1532 that are not connected to the device 1512 and the component 1524.

The cross-sectional view depicts a second substrate external layer 1538 over the second insulation layer 1530, the second horizontal conductive pathway 1532, and the single interlayer conductive connector 1536. The cross-sectional view also depicts an integrated circuit attach layer 1540, an integrated circuit 1542 having an integrated circuit inactive side 1544 and an integrated circuit active side 1546, an internal interconnect 1548, and an encapsulation 1550. The second substrate external layer 1538, the integrated circuit attach layer 1540, the integrated circuit 1542, the internal interconnect 1548, and the encapsulation 1550 can be formed in a manner similar to the second substrate external layer 104 of FIG. 3, the integrated circuit attach layer 114 of FIG. 3, the integrated circuit 116 of FIG. 3, the internal interconnect 118 of FIG. 3, and the encapsulation 120 of FIG. 3, respectively.

Figure 16:
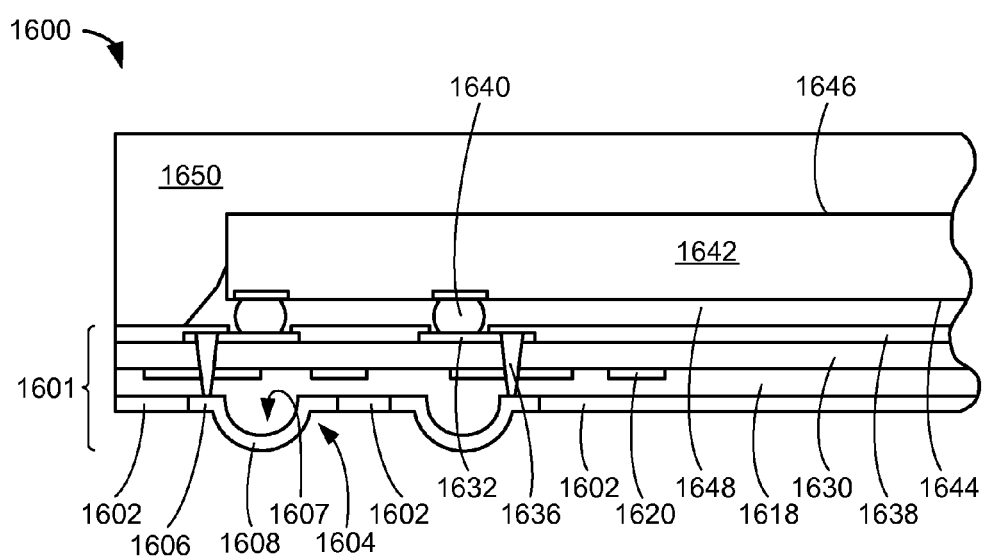
FIG. 16 is a cross-sectional view similar to FIG. 3 of an integrated circuit packaging system in a fourth embodiment of the present invention.

Referring now to FIG. 16, therein is shown a cross-sectional view similar to FIG. 3 of an integrated circuit packaging system 1600 in a fourth embodiment of the present invention. The integrated circuit packaging system 1600 can be similar to the integrated circuit packaging system 100 of FIG. 3, except for the integrated circuit attach layer 114 of FIG. 3, the integrated circuit 116 of FIG. 3, and the internal interconnect 118 of FIG. 3.

The cross-sectional view depicts a substrate 1601 having a substrate external layer 1602 and a convex interconnect 1604, having a horizontal flange 1606, a cavity 1607, and a protrusion 1608, adjacent the substrate external layer 1602. The substrate external layer 1602 and the convex interconnect 1604 can be formed in a manner similar to the first substrate external layer 102 of FIG. 3 and the convex interconnect 106 of FIG. 3, respectively.

The cross-sectional view also depicts a first insulation layer 1618, a first horizontal conductive pathway 1620, a second insulation layer 1630, and a second horizontal conductive pathway 1632. The first insulation layer 1618, the first horizontal conductive pathway 1620, the second insulation layer 1630, and the second horizontal conductive pathway 1632 can be formed in a manner similar to the first insulation layer 306 of FIG. 3, the first horizontal conductive pathway 310 of FIG. 3, the second insulation layer 308 of FIG. 3, and the second horizontal conductive pathway 312 of FIG. 3, respectively.

The cross-sectional view further depicts a single interlayer conductive connector 1636 and a second substrate external layer 1638. The single interlayer conductive connector 1636 and the second substrate external layer 1638 can be formed in a manner similar to the single interlayer conductive connector 112 of FIG. 3 and the second substrate external layer 104 of FIG. 3, respectively.

The integrated circuit packaging system 1600 can include an internal interconnect 1640, such as a solder ball, a stud bump, a solder column, a metal conductor, or a metallic alloy conductor. An integrated circuit 1642, such as a flip-chip, an integrated circuit die, a packaged integrated circuit, or a bumped chip, can be mounted over the second substrate external layer 1638. The integrated circuit 1642 can be attached or connected to the second horizontal conductive pathway 1632 with the internal interconnect 1640.

The integrated circuit 1642 can include an integrated circuit active side 1644 having active circuitry thereon and an integrated circuit inactive side 1646, such as a backside, at an opposing side to the integrated circuit active side 1644. The internal interconnect 1640 can be electrically connected to the second horizontal conductive pathway 1632 and the integrated circuit active side 1644.

An underfill 1648, such as an epoxy resin or any underfill resin material, can be formed or dispensed in a space between the second substrate external layer 1638 and the integrated circuit 1642. The underfill 1648 can protect or encapsulate the internal interconnect 1640.

An encapsulation 1650 can be formed or molded over the substrate external layer 1602, the convex interconnect 1604, the first insulation layer 1618, the first horizontal conductive pathway 1620, the second insulation layer 1630, the second horizontal conductive pathway 1632, the single interlayer conductive connector 1636, and the second substrate external layer 1638. The encapsulation 1650 can cover the internal interconnect 1640, the integrated circuit 1642, and the underfill 1648. The substrate external layer 1602 and the convex interconnect 1604 can be exposed from the bottom of the integrated circuit packaging system 1600.

For illustrative purposes, the cross-sectional view depicts the underfill 1648, although it is understood that the underfill 1648 can be optionally formed. For example, the encapsulation 1650 can be formed in the space between the second substrate external layer 1638 and the integrated circuit 1642, protecting or covering the internal interconnect 1640.

Also for illustrative purposes, the cross-sectional view depicts the encapsulation 1650, although it is understood that the encapsulation 1650 can be optionally formed. For example, the integrated circuit packaging system 1600 can include the integrated circuit 1642 attached to the second horizontal conductive pathway 1632 with the internal interconnect 1640 and the underfill 1648 dispensed in the space between the second substrate external layer 1638 and the integrated circuit 1642.

A portion of the top surface of the second substrate external layer 1638, the integrated circuit 1642, or the underfill 1648 can be partially exposed to ambient, which includes an environment that surrounds the integrated circuit packaging system 1600. In other words, the portion of the top surface of the second substrate external layer 1638, the integrated circuit 1642, or the underfill 1648 is exposed without the encapsulation 1650.

Figure 17:
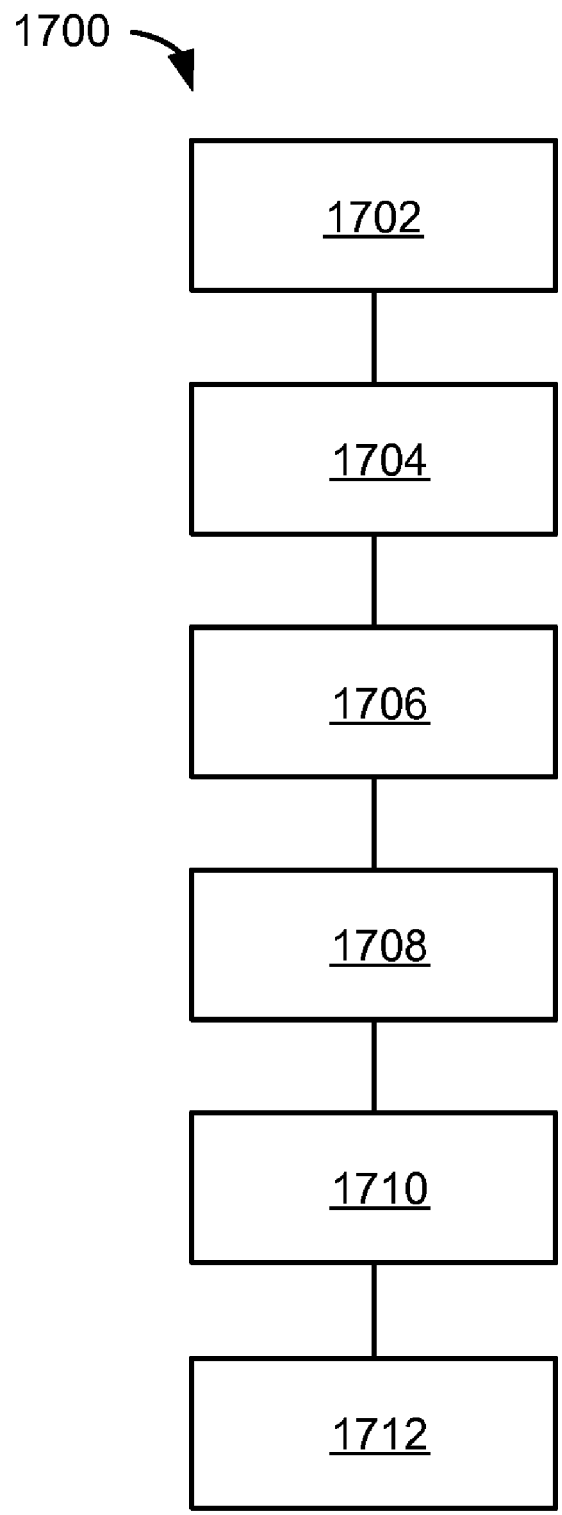
FIG. 17 is a flow chart of a method of manufacture of an integrated circuit packaging system in a further embodiment of the present invention.

Referring now to FIG. 17, therein is shown a flow chart of a method 1700 of manufacture of an integrated circuit packaging system in a further embodiment of the present invention. The method 1700 includes: providing a first substrate external layer having an opening in a block 1702; forming a convex interconnect within the opening with the convex interconnect having a protrusion and a horizontal flange substantially horizontally coplanar with the first substrate external layer in a block 1704; forming an insulation layer over the first substrate external layer and the convex interconnect in a block 1706; forming a horizontal conductive pathway on the insulation layer in a block 1708; forming a single interlayer conductive connector from the horizontal conductive pathway to the convex interconnect in a block 1710; and connecting an integrated circuit and the horizontal conductive pathway in a block 1712.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a first substrate external layer having an opening;
   forming a convex interconnect within the opening with the convex interconnect having a protrusion and a horizontal flange substantially horizontally coplanar with the first substrate external layer;
   forming an insulation layer over the first substrate external layer and the convex interconnect;
   forming a horizontal conductive pathway on the insulation layer;
   forming a single interlayer conductive connector from the horizontal conductive pathway to the convex interconnect, the single interlayer conductive connector through the horizontal conductive pathway and the insulation layer;
   forming a second substrate external layer over the single interlayer conductive connector, the second substrate external layer having a hole exposing the horizontal conductive pathway; and
   connecting an integrated circuit and the horizontal conductive pathway with the integrated circuit over the second substrate external layer.

2. The method as claimed in claim 1 wherein forming the single interlayer conductive connector includes forming the single interlayer conductive connector from the horizontal conductive pathway to the horizontal flange.

3. The method as claimed in claim 1 wherein forming the single interlayer conductive connector includes forming the single interlayer conductive connector from the horizontal conductive pathway to the protrusion.

4. The method as claimed in claim 1 further comprising:
   mounting a device over the first substrate external layer; and
   wherein forming the insulation layer over the first substrate external layer includes:
   forming the insulation layer over the device.

5. A method of manufacture of an integrated circuit packaging system comprising:
   providing a first substrate external layer having an opening;
   forming a convex interconnect within the opening with the convex interconnect having a protrusion and a horizontal flange substantially horizontally coplanar with the first substrate external layer;
   forming an insulation layer over the first substrate external layer and the convex interconnect;
   forming a horizontal conductive pathway on the insulation layer;
   forming a single interlayer conductive connector from the horizontal conductive pathway to the convex interconnect, the single interlayer conductive connector through the horizontal conductive pathway and the insulation layer;
   forming a second substrate external layer over the single interlayer conductive connector, the second substrate external layer having a hole exposing the horizontal conductive pathway; and
   connecting an integrated circuit and the horizontal conductive pathway with the integrated circuit over the first substrate external layer and the second substrate external layer.

6. The method as claimed in claim 5 further comprising:
   mounting a device over the first substrate external layer; and
   wherein forming the insulation layer includes:
   forming the insulation layer over the device.

7. The method as claimed in claim 5 further comprising:
   mounting a component over the insulation layer; and
   connecting a component conductive connector to the component and the horizontal conductive pathway.

8. The method as claimed in claim 5 further comprising dispensing an underfill between the second substrate external layer and the integrated circuit.

9. The method as claimed in claim 5 wherein connecting the integrated circuit includes connecting a flip chip.

10. An integrated circuit packaging system comprising:
    a first substrate external layer having an opening;
    a convex interconnect within the opening with the convex interconnect having a protrusion and a horizontal flange substantially horizontally coplanar with the first substrate external layer;
    an insulation layer over the first substrate external layer and the convex interconnect;
    a horizontal conductive pathway on the insulation layer;
    a single interlayer conductive connector from the horizontal conductive pathway to the convex interconnect, the single interlayer conductive connector through the horizontal conductive pathway and the insulation layer;
    a second substrate external layer over the single interlayer conductive connector, the second substrate external layer having a hole exposing the horizontal conductive pathway; and
    an integrated circuit connected to the horizontal conductive pathway with the integrated circuit over the second substrate external layer.

11. The system as claimed in claim 10 wherein the single interlayer conductive connector includes the single interlayer conductive connector from the horizontal conductive pathway to the horizontal flange.

12. The system as claimed in claim 10 wherein the single interlayer conductive connector includes the single interlayer conductive connector from the horizontal conductive pathway to the protrusion.

13. The system as claimed in claim 10 further comprising:
    a device over the first substrate external layer; and
    wherein:
    the insulation layer is over the device.

14. The system as claimed in claim 10 wherein the integrated circuit is over the first substrate external layer.

15. The system as claimed in claim 14 further comprising:
    a device over the first substrate external layer; and
    wherein the insulation layer includes:
    the insulation layer over the device.

16. The system as claimed in claim 14 further comprising:
    a component over the insulation layer; and
    a component conductive connector connected to the component and the horizontal conductive pathway.

17. The system as claimed in claim 14 further comprising an underfill between the second substrate external layer and the integrated circuit.

18. The system as claimed in claim 14 wherein the integrated circuit includes a flip chip.

* * * * *